United States Patent [19]

Scheuch et al.

[11] Patent Number: 4,990,035
[45] Date of Patent: Feb. 5, 1991

[54] CONTOUR MILLING CUTTER

[75] Inventors: Anton Scheuch, Ravensburg; Johann Schmidt, Bainfurt, both of Fed. Rep. of Germany

[73] Assignee: Hawera Präzisionswerkzeuge GmbH, Ravensburg, Fed. Rep. of Germany

[21] Appl. No.: 390,392

[22] Filed: Aug. 7, 1989

[30] Foreign Application Priority Data

Sep. 30, 1988 [DE] Fed. Rep. of Germany ....... 3833204

[51] Int. Cl.⁵ .............................................. B26D 01/12
[52] U.S. Cl. ......................................... 407/30; 29/78; 407/58; 407/59
[58] Field of Search .................... 407/30, 55, 56, 58, 407/59, 61, 31; 29/78

[56] References Cited

U.S. PATENT DOCUMENTS 3,058,199 10/1962 Cave et al. .
3,129,492 4/1964 Strasmann ............................ 407/59
3,913,196 10/1975 Maday .

FOREIGN PATENT DOCUMENTS 736449 6/1943 Fed. Rep. of Germany .
2338297 10/1975 Fed. Rep. of Germany .
3243522 5/1984 Fed. Rep. of Germany .
3517135 11/1986 Fed. Rep. of Germany .
8803812 10/1988 Fed. Rep. of Germany .

Primary Examiner—Frederick R. Schmidt
Assistant Examiner—Lawrence Cruz
Attorney, Agent, or Firm—Spencer & Frank

[57] ABSTRACT

A cutting tool for machining printed circuit boards and the like includes a cutting part having an longitudinal axis of rotation, an outer surface, and a plurality of staggered teeth formed on the outer surface. The cutting part has a first predetermined number of main cutting grooves formed in the outer surface and which extend along the cutting part at a first lead angle, as well as a second predetermined number of divider grooves intersecting the main cutting grooves. The divider grooves extend along the cutting part at a second lead angle. The main cutting grooves and the divider grooves define teeth. The first predetermined number is a prime number and the second predetermined number is greater than the first predetermined number by two, such that the teeth are staggered as viewed in a radial direction which is perpendicular to the longitudinal axis and such that each of the teeth partially overlaps in the radial direction at least another one of the teeth.

10 Claims, 2 Drawing Sheets

CONTOUR MILLING CUTTER

BACKGROUND OF THE INVENTION

The invention relates to a cutting tool, in particular a contour milling cutter for machining printed circuit boards or the like having a cutting part with staggered teeth, the staggered teeth being defined by main cutting grooves which are intersected by a plurality of divider grooves.

Contour milling cutters have been disclosed for the machining of in particular glass-fiber reinforced printed circuit boards, said contour milling cutters generally consisting of solid carbide material having a pyramid-like tooth shape and a diameter of 0.4 to 3 mm. The period of use or the useful length of the tool is essentially determined by the nature of the material to be machined and by the cutting-edge geometry of the individual cutting edges of the milling cutter. For the cutting-edge geometry, a so-called staggered toothing or also diamond toothing is employed. For this purpose, the tool is provided with a particular number of main cutting grooves having main cutting edges with a particular lead which are intersected by a particular number of divider grooves or secondary cutting grooves having an opposing lead. The main cutting grooves are divided by the divider grooves into subregions, so that each initially continuous main cutting edge is divided by the divider grooves into a multiplicity of individual cutting elements of small width. This is necessary in order to reduce the stressing of the cutting edge and the heating up of the contour milling cutter in order to decrease the risk of breakage.

Hitherto, the following criteria have been considered in the production of the staggered toothing consisting of main cutting grooves and opposing divider grooves. If the number and lead angle of main cutting grooves and divider grooves are chosen to be the same, axial gaps which have no cutting tooth are produced. Therefore this method is generally unsuitable for the production of staggered toothing.

In order to avoid obtaining axial gaps in the cutting zone, one method of producing staggered toothings provides that the number of main cutting grooves is chosen to be different from the number of divider grooves while the lead angle of both groove types remains the same. If, for example, a difference of "1" between the number of main cutting grooves and divider grooves is chosen, for example seven main cutting grooves and eight divider grooves while the lead remains the same, one individual cutting element is obtained at one axial level, i.e. in one radial plane on the entire periphery, which is succeeded, as seen axially, by a further individual cutting element which is offset by a particular angle on the periphery, no overlap of the cutting teeth occurring in the axial direction.

If a difference of "2" between the number of main cutting grooves and divider grooves is chosen, e.g. eight main cutting grooves and ten divider grooves, this produces a milling tool in which two individual cutting elements are arranged offset by a particular angle at one axial level, i.e. in one radial plane. Here too, the further cutting elements arranged in a different axial position merely succeed one another without an axial overlap of individual cutting elements occurring. A development of the cutting shell of such a contour milling cutter is shown in FIG. 5. In this arrangement, eight main cutting grooves and ten divider grooves have been chosen. The vertical dashed region indicates the respective subregion of the start and end of two axially successive teeth with direct corner succession. This is described in greater detail below.

If an equal number of main cutting grooves and divider grooves is chosen in combination with different lead angles of the two groove types, this does give a multiplicity of cutting elements at one particular axial level, i.e. in a particular radial plane, said cutting elements being arranged offset with respect to one another in accordance with the magnitude of the lead differences. However, a multiplicity of cutting elements arranged in the same radial plane increases the frictional forces and reduces the cutting pressure on the individual cutting tooth or individual cutting element. This production method is therefore also unsatisfactory.

SUMMARY OF THE INVENTION

The object on which the invention is based is to create an improved cutting-edge geometry of a milling tool, in particular of a contour milling cutter for machining printed circuit boards, the stressing in particular of the corner regions of the cutting teeth being reduced and hence the tool lives being increased with a simultaneous increase in the cutting capacity and a reduction of heat generation.

This object is achieved according to the invention, starting from a tool of the type described at the outset, by main cutting grooves which extend along the cutting part at a first lead angle and a second predetermined number of divider grooves intersecting the main cutting grooves, the divider grooves extending along the cutting part at a second lead angle, the first predetermined angle of the main cutting grooves being substantially equal to the second predetermined angle of the divider grooves, wherein the first predetermined number is a prime number and wherein the second predetermined number is greater than the first predetermined number by two, such that the teeth are staggered as viewed in a radial direction which is perpendicular to the longitudinal axis and such that each of the teeth partially overlaps in the radial direction at least another one of the teeth.

The invention is based on the realization that an optimum efficiency of the contour milling cutter is achieved if only one cutting tooth or individual cutting element of the main cutting edge comes into cutting engagement at one axial level, i.e. in one radial plane, since a maximum cutting ability in combination with a minimum heat generation is thereby achieved. Even two cutting teeth on the periphery or on the same radial plane considerably increase heat generation, and this leads to premature wear. According to the invention, however, the individual cutting element or the cutting tooth arranged in one radial plane is overlapped by a further cutting tooth or individual cutting element arranged somewhat axially offset, the overlap occupying possibly up to half of the width of each cutting tooth. In this arrangement, the axially overlapping cutting tooth is arranged offset by a particular angle on the periphery. The overlap can be varied to a certain extent depending on the width of the main cutting grooves and/or divider grooves chosen.

The overlap of the individual cutting elements or this tooth overlap has the advantage that these individual cutting elements are not stressed to the same degree in their corner regions as is the case when the individual cutting elements succeed one another axially without overlap. It is precisely the corner regions of the cutting teeth which are particularly sensitive to wear, with the result that the design according to the invention leads to a considerable increase in tool lives and to an increase in capacity. At a cutting rate of between 220 m/min. and 260 m/min, an increase in capacity of up to 70% has been measured. At the same time, it was possible to increase the tool life by 25%.

Decisive for the contour milling cutter geometry essential to the invention is the selection of the number of main cutting grooves and of associated divider grooves. If the number of main cutting grooves is chosen to be a mathematical prime number, i.e. a number which can only be divided by itself and the number "1" and the number of divider grooves is furthermore selected in a particular ratio to the prime number selected, in particular plus two grooves, the milling cutter geometry according to the invention is obtained with preferably only one cutting tooth or individual cutting element arranged in one radial plane, i.e. at one axial level, at the main cutting edge and one further cutting tooth overlapping axially with this cutting tooth. The tooth overlap is here designed to be $1\frac{1}{2}x +/- 0.1x$.

The selection of the prime number "7" for the number of main cutting grooves and "9" for the divider grooves with an identical helix lead angle of $\alpha_1 = \alpha_2 \approx 22°$ to $24°$ for the main cutting grooves and the divider grooves, respectively, is particularly advantageous. A tool having a greatly increased capacity is thereby obtained.

It is furthermore advantageous here if the lead angle $\beta$ of the individual cutting edges of the main cutting groove which follow one another in the development occupies an angle of magnitude $\beta \approx 71°$ to $74°$ to the tool axis.

The groove depths of the main cutting groove and of the divider groove are expediently selected to be of the order of 12 to 16% of the nominal diameter. This produces a sufficient groove depth for removing the millings without the tooth root and the core diameter being excessively weakened.

The milling tool can be equipped with a left-hand or right-hand helix depending on the application.

In the case of the tooth geometry according to the invention, the width of the individual cutting elements or each individual cutting tooth can be calculated in detail from the formula given in the description. In this way, and in conjunction with the groove width, the tooth geometry of the milling cutter can be precisely determined.

In order to achieve the greatly increased capacity, a material of ultra fine-grain sintered carbide having a grain size of $\approx 0.4$ M is selected with a Vicker's hardness $VH > 1800$, in particular $VH = 2000$ N/mm$^2$ and a breaking strength $\sigma B > 2800$ N/mm$^2$.

BRIEF DESCRIPTION OF THE DRAWINGS

Further details and advantages of the invention emerge from the following description of the figures.

DETAILED DESCRIPTION OF THE PREFERRED EMBODIMENT

Figure 1:
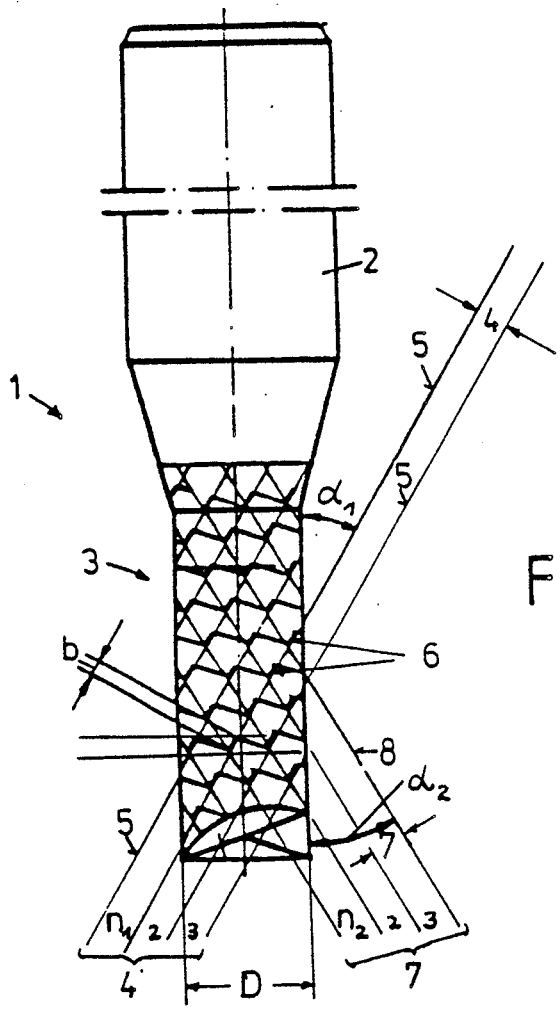
FIG. 1 is a side elevational view of a known milling tool.

A known milling tool is illustrated schematically in FIG. 1 to clarify the terms. The milling tool 1 comprises a clamping shank 2 and a cutting part 3 having a so-called staggered toothing. In connection with the illustration according to FIG. 5, which represents a development of the cutting part having staggered toothing in known form, $n_1 =$ eight main cutting grooves 4 lying next to one another are, for example, made in the cutting part 3 at a lead angle $\alpha_1$ to form the main cutting edges 5.

In order to interrupt the helically extending main cutting edges 5 along their length or in order to produce the individual cutting elements or cutting teeth 6, so-called divider grooves 7 are made at an opposing angle $\alpha_2$. In the illustration according to FIG. 5, these are $n_2 = 10$ divider grooves in the case of a known milling tool. The divider grooves form a secondary cutting edge 8 which, however, does not act as an actual cutting edge.

Figure 5:
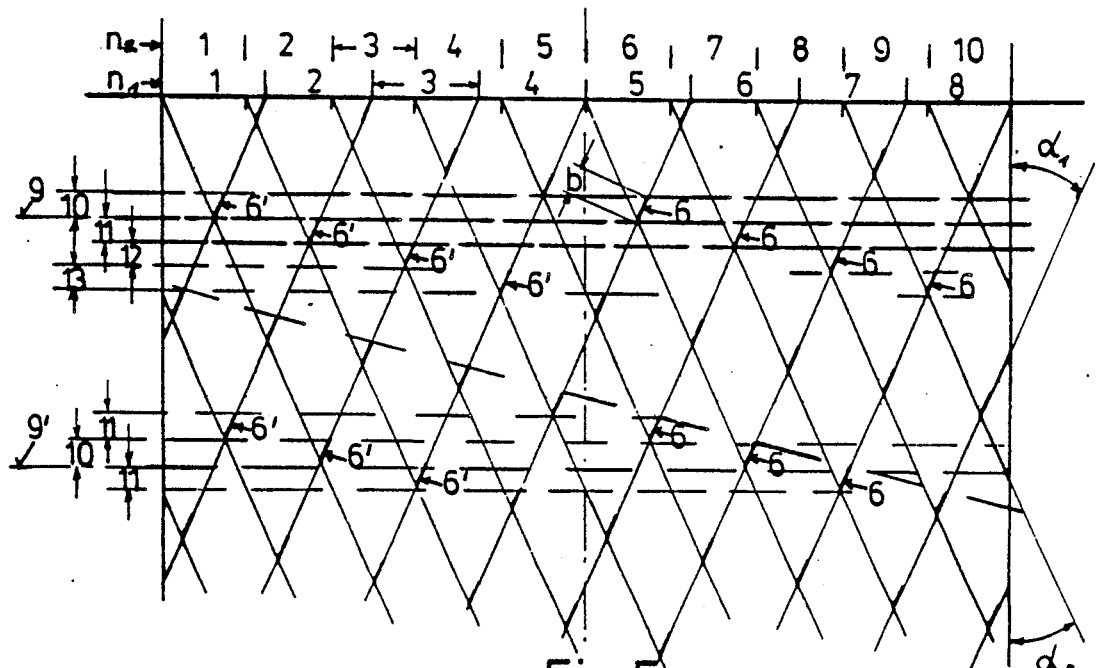
FIG. 5 is a developmental view of the know cutting tool of FIG. 1.

If the cutting part 3 illustrated only schematically in FIG. 1 is considered with reference to the example of a known milling cutter according to FIG. 5 having a ratio $n_1:n_2 = 8:10$ and a lead angle of the main cutting grooves and secondary cutting grooves of $\alpha_1 = \alpha_2$, it can be seen at each axial level or in each radial plane 9, 9' etc. that there are always two individual cutting elements, 6, 6' distributed at the periphery in the respective vertical portion region (e.g. 10) at the periphery of the staggered toothing. In the illustration according to FIG. 5, the cutting tooth following on in the axial direction lies in the next vertical portion region 11, above or below vertical portion region 10, with the result that there is no overlapping of the cutting teeth 6, 6' but only an axial succession through the adjoining vertical portion regions. Two further vertical portion regions 12, 13 are additionally illustrated in FIG. 5 for the purpose of better illustration, each vertical portion region 10 to 13 and the following ones always having, in side projection, the width b' of a cutting teeth 6, 6'. The actual width is indicated by "b".

Figure 4:
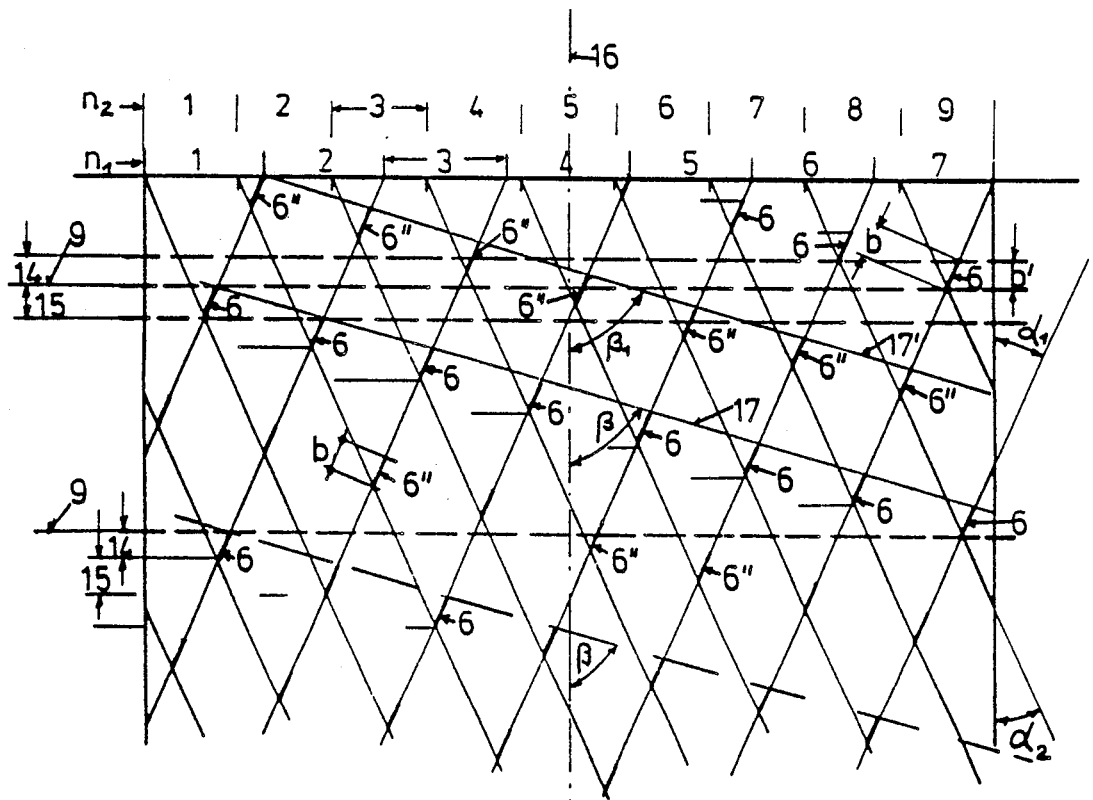
FIG. 4 is a developmental view of the grooved cutting tool of FIGS. 3 and 4.

In the case of the present invention, in a preferred exemplary embodiment, the prime number to be used for the number of main cutting grooves is chosen to be $n_1 = 7$ and the number of divider grooves $n_2 = 9$, as illustrated in the exemplary embodiment of the invention according to FIG. 4. Here the helix lead angle $\alpha_1 = \alpha_2$ and is in a range of about $22°$ to $24°$. In the preferred embodiment, $\alpha_1 = \alpha_2 = 23°$.

From the graphical representation of the development in FIG. 4 it can be seen that only one single individual cutting element 6 (cutting tooth) of width "b" (and housing a width b' in side view), which corresponds to the vertical portion region 14, is present in a particular axial vertical portion region 14, i.e. at a particular axial level or in a particular radial plane 9. The next vertical portion region 15 following it also has only one cutting tooth 6 on its entire periphery.

According to the invention, however, successive vertical portion regions 14, 15 are bridged by cutting teeth 6" overlapping these regions, each cutting tooth 6 being overlapped within a vertical portion 14, 15 by about 50% by the cutting tooth 6" from the adjoining vertical portion. There exists therefore a tooth overlap of $\frac{1}{2}$ tooth in an adjacent following vertical portion region, which can preferably vary by $+/- 0.1x$.

The width b of each individual cutting element or each cutting tooth 6, 6', 6" can be calculated from the formula $$b = \frac{D \cdot \pi}{\tan \alpha} \cdot \frac{1}{n_1 \cdot n_2}$$

where:
D=nominal diameter of the cutting part
$\alpha = \alpha_1 \alpha_2 =$ lead angle of main cutting groove 4 and divider groove 7
$n_1 =$ number of main cutting grooves 4
$n_2 =$ number of divider grooves 7

The axially successive cutting teeth 6 in each vertical portion region 14, 15 etc., which are however offset on the periphery, lie on a line 17 having the lead angle $\beta$ of between 74° and 71° to the longitudinal axis 16 of the tool. Equally, the cutting teeth 6", which in each case overlap by half the cutting teeth 6, likewise lie on a line 17' having a lead angle $\beta_1$, where $\beta_1 = \beta$.

Accordingly it can be seen from the illustration according to FIG. 4 that only a single cutting tooth 6 is ever present at each axial level or in each radial plane 9, which cutting tooth is half overlapped—as seen axially—by the next tooth 6". This applies in both axial directions of the cutting tooth. In FIG. 4, the cutting teeth succeeding one another axially, i.e. which do not overlap, are designated by 6 and the teeth which overlap with these cutting teeth are designated by 6".

By virtue of the tooth overlap, the tooth corners are less highly stressed. In addition, there is a high cutting capacity since there is only one complete cutting tooth in each radial plane.

It is accordingly essential for the invention that a prime number should be used for the number $n_1$ of main cutting grooves. In the exemplary embodiment according to FIG. 4, this is the prime number "7". The following ratio of the number of main cutting grooves to divider grooves would be possible and would be technically advantageous:

| $n_1$ | 5 | 7 | 11 | 13 |
|---|---|---|---|---|
| $n_2$ | 7 | 9 | 13 | 15 |

When a prime number is chosen for the number of main cutting grooves, the above-described milling properties are achieved, an overlap of the cutting teeth occurring in all cases. The degree or extent of the overlap is determined to a certain extent by the width of the divider groove.

Figure 2:
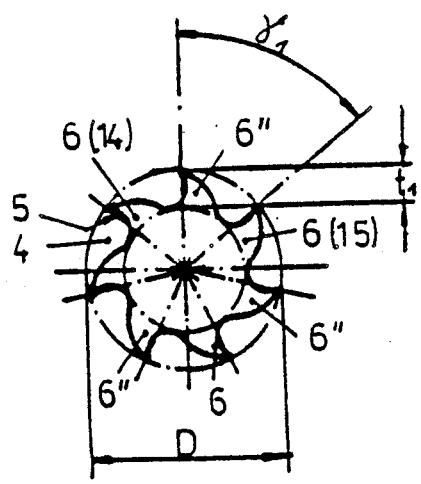
FIGS. 2 and 3 are bottom elevation views of an exemplary embodiment of the invention.

To complete the illustration, FIG. 2 additionally illustrates a bottom or end view of the main cutting edge with the cutting teeth 6 and the cutting teeth 6" arranged axially offset thereto. The associated vertical portion region 14, 15 etc. is given in brackets after the cutting tooth 6; e.g. 6 (14) refers to the cutting tooth 6 in vertical portion region 14. Of course, the cutting teeth 6 illustrated in FIG. 2 lie at different axial levels or in different radial planes, these planes being represented in FIG. 4.

The angular pitch is $$\gamma_1 = \frac{360}{n_1}$$

In the case of seven main cutting grooves, $\gamma_1 = 51° 25' 43''$. The depth of the main cutting groove is indicated by $t_1$, this being 12 to 16% of the nominal diameter D of the milling tool.

Figure 3:
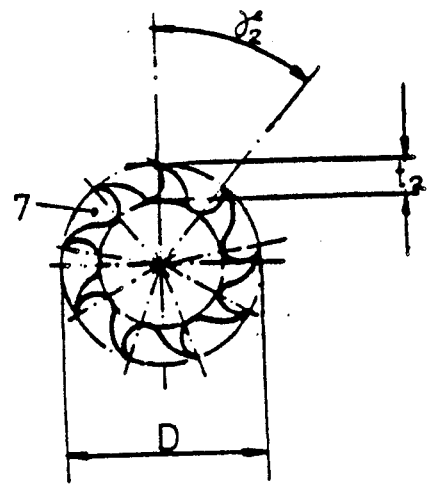

FIG. 3 represents an end view of the secondary cutting edges (unnumbered) produced by the divider grooves 7. The angular pitch is $$\gamma_2 = \frac{360°}{n_2}$$

In the case of $n_2 = 9$ divider grooves, $\gamma_2 = 40°$. The groove depth $t_2$ of the divider grooves 7 is in the same order of magnitude as the groove depth $t_1$ of the main cutting grooves 5, in particular $t_1$ is preferably equal to $t_2$.

The invention is not limited to the exemplary embodiment illustrated and described. On the contrary, it also encompasses all expert modifications and further developments of the invention without any inventive content of their own.

We claim:

1. A cutting tool, for machining printed circuit boards and the like, comprising:
a cutting part having a longitudinal axis of rotation, an outer surface, and a plurality of staggered teeth formed on said outer surface, said cutting part having a first predetermined number of main cutting grooves formed in said outer surface which extend along said cutting part at a first lead angle and a second predetermined number of divider grooves intersecting said main cutting grooves, said divider grooves extending along said cutting part at a second lead angle, said main cutting grooves and said divider grooves defining said plurality of teeth, said first predetermined angle of said main cutting grooves being substantially equal to said second predetermined angle of said divider grooves, wherein said first predetermined number is a prime number and wherein said second predetermined number is greater than said first predetermined number by two, such that said teeth are staggered as viewed in a radial direction which is perpendicular to said longitudinal axis and such that each of said teeth partially overlaps in said radial direction at least another one of said teeth.

2. A tool as claimed in claim 1, wherein, as viewed in said radial direction at a given axial position along said longitudinal axis, any two adjacent leading ones of said cutting teeth are spaced a first distance apart, and wherein any two cutting teeth which are adjacent as viewed along any one of said divider grooves are separated by a distance which is greater than said first distance.

3. A tool as claimed in claim 1, wherein said first predetermined angle of said main cutting grooves and said second predetermined angle of said divider grooves are substantially equal and are in a range of 22° to 24°, said first predetermined number of said main cutting grooves is equal to seven, and said second predetermined number of said divider grooves is equal to nine.

4. A tool as claimed in claim 1, wherein said divider grooves extend at a lead angle $\beta$ which is in a range between 71° and 74° to said longitudinal axis.

5. A tool as claimed in claim 1, wherein each of said main cutting grooves has a predetermined depth, and each of said divider grooves has a depth which is approximately equal to said predetermined depth, and wherein said predetermined depth is in a range of about 12% to 16% of the nominal diameter of the tool.

6. A tool as claimed in claim 1, wherein said main cutting groove extends in a left-hand helix along said outer surface of said, and said divider grooves extend in a right-hand helix along said outer surface.

7. A tool as claimed in claim 1, wherein the width of an individual cutting element of the main cutting groove is obtained from the formula:

$$b = \frac{D \cdot \pi}{\tan \alpha} \cdot \frac{1}{n_1 \, n_2}$$

where

D = nominal diameter of said cutting part;

$\alpha$ is equal to said first lead angle of said main cutting grooves, and is also equal to said second lead angle of said divider grooves;

$t_1$ = said first predetermined number of said main cutting grooves; and $t_2$ = said second predetermined number of said divider grooves.

8. A tool as claimed in claim 1, wherein said cutting part is composed of an ultra fine-grain sintered carbide material having a grain size of about 0.4μ and a Vicker's hardness VH = 1800 N/mm².

9. A tool as claimed in claim 1, wherein said main cutting groove extends in a right-hand helix along said outer surface of said, and said divider grooves extend in a left-hand helix along said outer surface.

10. A tool as claimed in claim 1, wherein said cutting part is composed of an ultra fine-grain sintered carbide material having a grain size of about 0.4μ and a Vicker's hardness VH = 2000 N/mm² and a breaking strength $\sigma_B$ > 2800 N/mm².

* * * * *